(12) United States Patent
Kobayashi et al.

(10) Patent No.: US 9,401,459 B2
(45) Date of Patent: *Jul. 26, 2016

(54) PHOSPHOR AND LIGHT-EMITTING DEVICE

(75) Inventors: Keita Kobayashi, Omuta (JP); Kohki Ichikawa, Omuta (JP); Yasuhito Fushii, Omuta (JP); Hideyuku Emoto, Machida (JP); Suzuya Yamada, Machida (JP)

(73) Assignee: DENKA COMPANY LIMITED, Tokyo (JP)

( * ) Notice: Subject to any disclaimer, the term of this patent is extended or adjusted under 35 U.S.C. 154(b) by 18 days.

This patent is subject to a terminal disclaimer.

(21) Appl. No.: 14/377,487

(22) PCT Filed: Aug. 9, 2012

(86) PCT No.: PCT/JP2012/070392
§ 371 (c)(1),
(2), (4) Date: Oct. 27, 2014

(87) PCT Pub. No.: WO2013/118330
PCT Pub. Date: Aug. 15, 2013

(65) Prior Publication Data
US 2015/0054010 A1    Feb. 26, 2015

(30) Foreign Application Priority Data

Feb. 9, 2012 (JP) ................. 2012-026587

(51) Int. Cl.
| | |
|---|---|
| *H01L 33/00* | (2010.01) |
| *H01L 33/50* | (2010.01) |
| *C09K 11/08* | (2006.01) |
| *C09K 11/59* | (2006.01) |
| *C09K 11/62* | (2006.01) |
| *C09K 11/64* | (2006.01) |
| *H01L 33/48* | (2010.01) |

(52) U.S. Cl.
CPC ............. *H01L 33/502* (2013.01); *C09K 11/08* (2013.01); *C09K 11/59* (2013.01); *C09K 11/592* (2013.01); *C09K 11/62* (2013.01); *C09K 11/64* (2013.01); *C09K 11/646* (2013.01); *H01L 33/486* (2013.01); *H01L 33/504* (2013.01); *Y02B 20/181* (2013.01)

(58) Field of Classification Search
CPC ... H01L 33/502; H01L 33/486; H01L 33/504; H01L 33/60; H01L 33/20; H01L 33/62; H01L 33/44; H01L 33/54; H01L 2224/48091; H01L 33/32; H01L 33/38
USPC ....................................... 257/98–99
See application file for complete search history.

(56) References Cited

U.S. PATENT DOCUMENTS

2015/0084079 A1* 3/2015 Kobayashi et al. ............. 257/98

FOREIGN PATENT DOCUMENTS

| | | |
|---|---|---|
| JP | 2007-180483 A | 7/2007 |
| JP | 2008-166825 A | 7/2008 |
| JP | 2009-65145 A | 3/2009 |
| JP | 2009-212508 A | 9/2009 |

OTHER PUBLICATIONS

Office Action dated Aug. 5, 2015, issued to U.S. Appl. No. 14/377,071.
International Search Report mailed Sep. 11, 2012, issued to corresponding International Application No. PCT/JP2012/070392.

* cited by examiner

*Primary Examiner* — Dilinh Nguyen
(74) *Attorney, Agent, or Firm* — Stein IP, LLC

(57) ABSTRACT

A high-brightness phosphor having high-temperature characteristics and long-term reliability, and a white light-emitting device using this phosphor are provided. The phosphor contains a silicate phosphor (A) having a peak wavelength of at least 525 nm but not higher than 535 nm and fluorescence intensity of at least 250% but not higher than 270%; an oxynitride phosphor (B) having a peak wavelength of at least 540 nm but not higher than 545 nm and fluorescence intensity of at least 260% but not higher than 280%; and an nitride phosphor (C) having a peak wavelength of at least 615 nm but not higher than 625 nm, wherein the amount of the silicate phosphor (A) is at least 20% but not higher than 35% by mass, the amount of the oxynitride phosphor (B) is at least 50% but not higher than 70% by mass, and the amount of the nitride phosphor (C) is at least 10% but not higher than 20% by mass.

6 Claims, No Drawings

PHOSPHOR AND LIGHT-EMITTING DEVICE

CROSS-REFERENCE TO RELATED APPLICATIONS

This application is a national stage of International Application No. PCT/JP2012/070392, filed Aug. 9, 2012, which claims the benefit of Japanese Application No. 2012-026587, filed Feb. 9, 2012, in the Japanese Patent Office. All disclosures of the document(s) named above are incorporated herein by reference.

BACKGROUND OF THE INVENTION

1. Field of the Invention

The present invention relates to a phosphor used for a light emitting diode (LED) and a light-emitting device using an LED.

2. Description of the Related Art

As a phosphor used for a white light-emitting device, a combination of β-SiAlON and a red light-emitting phosphor is known (Patent Literature 1). A phosphor combining a red light-emitting phosphor and a green light-emitting phosphor that have specific color coordinates is disclosed by (Patent Literature 2).

CITATION LIST

Patent Literature

Patent Literature 1: JP 2007-180483 A
Patent Literature 2: JP 2008-166825 A

SUMMARY OF THE INVENTION

Technical Problem

A purpose of the present invention is to provide a phosphor achieving high brightness and high color-rendering properties at the same time by adding an oxynitride phosphor to an existing phosphor. Another purpose is to provide a white light-emitting device using this phosphor.

Solution to Problem

The phosphor of the present invention includes: a silicate phosphor (A) having a peak wavelength of at least 525 nm but not higher than 535 nm and fluorescence intensity of at least 250% but not higher than 270%; an oxynitride phosphor (B) having a peak wavelength of at least 540 nm but not higher than 545 nm and fluorescence intensity of at least 260% but not higher than 280%; and an nitride phosphor (C) having a peak wavelength of at least 615 nm but not higher than 625 nm, wherein the amount of the silicate phosphor (A) is at least 20% but not higher than 35% by mass, the amount of the oxynitride phosphor (B) is at least 50% but not higher than 70% by mass, and the amount of the nitride phosphor (C) is at least 10% but not higher than 20% by mass.

Assuming the amounts of the silicate phosphor (A) and that of the oxynitride phosphor (B) are a and b, it is preferable that they have the following relation: $1.5 \leq b/a \leq 3.5$.

Assuming the amounts of the silicate phosphor (A), that of the oxynitride phosphor (B), and that of the nitride phosphor (C) are a, b, and c, respectively, it is preferable that they have the following relation: $4.0 \leq (a+b)/c \leq 8.2$.

It is preferable that the oxynitride phosphor (B) is β-SiAlON, and the nitride phosphor (C) is SCASN.

The invention from another viewpoint as claimed herein the application is a light-emitting device having the above-described phosphor and an LED that mounts the phosphor on its light-emitting surface.

Advantageous Effects of Invention

According to the present invention, a high-brightness phosphor having high-temperature characteristics and ensuring long-term reliability, and a white light-emitting device using this phosphor can be provided.

Additional aspects and/or advantages of the invention will be set forth in part in the description which follows and, in part, will be obvious from the description, or may be learned by practice of the invention.

DETAILED DESCRIPTION OF THE EMBODIMENTS

The phosphor of the present invention includes: a silicate phosphor (A) having a peak wavelength of at least 525 nm but not higher than 535 nm and fluorescence intensity of at least 250% but not higher than 270%; an oxynitride phosphor (B) having a peak wavelength of at least 540 nm but not higher than 545 nm and fluorescence intensity of at least 260% but not higher than 280%; and an nitride phosphor (C) having a peak wavelength of at least 615 nm but not higher than 625 nm.

By mixing these phosphors (A), (B), and (C), a high-brightness phosphor having high-temperature characteristics and ensuring long-term reliability was obtained.

The amount of the silicate phosphor (A) is at least 20% but not higher than 35% by mass, the amount of the oxynitride phosphor (B) is at least 50% but not higher than 70% by mass, and the amount of the nitride phosphor (C) is at least 10% but not higher than 20% by mass.

If the amount of the silicate phosphor (A) is too low, the color-rendering properties tend to degrade, whereas if it is too high, high-temperature characteristics and long-term reliability tend not to be ensured easily, which is why the above range is preferable. If the amount of the oxynitride phosphor (B) is too low, high-temperature characteristics and long-term reliability tend not to be ensured easily, whereas if it is too high, high color-rendering properties tend not to be obtained. Similarly, if the amount of the nitride phosphor (C) is too low, high color-rendering properties tend not to be exhibited, and in extreme cases, white light itself tends not be obtained. If the amount is too high, the brightness tends to decrease, and in extreme cases, white light tends not be obtained.

The phosphor (A) of the present invention is a green light-emitting silicate phosphor having a peak wavelength of at least 525 nm but not higher than 535 nm and fluorescence intensity of at least 250% but not higher than 270%. Specifically, G3161, EG2762, EG3261, and EG3560 by Intematix, and SGA-530 and SGA-535 by Merck are available.

The fluorescence intensity of the phosphor is expressed in a percentage value relative to the peak height of standard sample (YAG, more specifically P46Y3 by Mitsubishi Chemical Corporation), which is regarded as 100%. To measure the fluorescence intensity, F-7000 spectrophotometer by Hitachi High-Technologies Corporation was used. The measurement method is described below.

<Measurement Method>

1) Setting samples: A measurement sample or a standard sample was packed in a quartz cell, and measurement was performed by setting the samples to a measuring apparatus alternately. The samples were packed in the cell up to approximately ¾ of the height of the cell, with the relative packing density maintained at approximately 35%.

2) Measurement: The samples were excited using a light of 455 nm, and the maximum peak height in a range from 500 nm to 700 nm was read. Measurement was performed five times, and the remaining three values excluding the maximum and the minimum values were averaged.

The phosphor (B) of the present invention is a green light-emitting oxynitride phosphor having a peak wavelength of at least 540 nm but not higher than 545 nm and fluorescence intensity of at least 260% but not higher than 280%. Specifically, it is β-SiAlON, and more specifically ALONBRIGHT (registered trademark) by DENKI KAGAKU KOGYO KABUSHIKI KAISHA is available.

The phosphor (C) of the present invention is an nitride phosphor having a peak wavelength of at least 615 nm but not higher than 625 nm. Specifically, it is a red phosphor abbreviated as and called SCASN. More specifically, BR-102D (peak wavelength: 620 nm) by Mitsubishi Chemical Corporation is available. To this nitride phosphor (C), R6436 (peak wavelength: 630 nm) or R6535 (peak wavelength: 640 nm) by Intematix, or BR-102C, BR-102F (peak wavelength: 630 nm) or BR-101A (peak wavelength: 650 nm) by Mitsubishi Chemical Corporation may be added for adjustment in an amount smaller than that of the nitride phosphor (C).

It is preferable that the amount of the silicate phosphor (A) is lower than that of the oxynitride phosphor (B) in order to maintain high reliability, and assuming the amounts of each as a and b, respectively, it is preferable that the following relation is maintained: $1.5 \leq b/a \leq 3.5$.

It is preferable that the amount of the nitride phosphor (C) is low because the clarity and clearness of the nitride phosphor (C) itself is low comparing with the silicate phosphor (A) and the oxynitride phosphor (B). However, if the amount is too low, the color-rendering properties also decrease, and in extreme cases, an LED may not generate white light emission. It is therefore preferable that their ratio falls within the following range: $4.0 \leq (a+b)/c \leq 8.2$.

The method for mixing the silicate phosphor (A), oxynitride phosphors (B) and nitride phosphor (C) can be selected as required, provided that they can be mixed uniformly or to a desired mixed state. A precondition of this mixing method is that entry of impurities is not allowed and that the shape and the particle size of the phosphors do not change.

The invention from another viewpoint as claimed in the application concerned is, as described previously, a light-emitting device having mixed phosphors and an LED that mounts the phosphors on its light-emitting surface. The phosphors mounted to the light-emitting surface of the LED are sealed by a sealing agent. Resin and glass are available as the sealing agent, and the resin includes a silicone resin. As the LED, it is preferable that a red light-emitting LED, blue light-emitting LED, and LED emitting other colors are selected as required depending on the light to be emitted ultimately. In the case of the blue light-emitting LED, the one made of a gallium nitride semiconductor, and having a peak wavelength of at least 440 nm but not higher than 460 nm is preferable. More preferably, the peak wavelength is at least 445 nm but not higher than 455 nm. The size of the light-emitting part of the LED is preferably 0.5 mm square or larger, and LED chips of any size can be selected, provided that they have the light-emitting part area as described above. The area preferably is 1.0 mm×0.5 mm, and more preferably 1.2 mm ×0.6 mm.

EXAMPLE

Examples of the present invention will be described in detail by referring to Tables and Comparative Examples.

TABLE 1

| Phosphor | | Peak wavelength (nm) | Fluorescence intensity (%) | Manufacturer, Model No. |
|---|---|---|---|---|
| Phosphor (A) | P1 | 512 | 242 | EG2060 by Intematix |
| | P2 | 525 | 253 | EG2762 by Intematix |
| | P3 | 530 | 264 | SGA530 by Merck |
| | P4 | 540 | 251 | EG3759 by Intematix |
| Phosphor (B) | P5 | 538 | 218 | ALONBRIGHT F4-SW by DENKI KAGAKU KOGYO KABUSHIKI KAISHA |
| | P6 | 542 | 269 | ALONBRIGHT GR-MW540H by DENKI KAGAKU KOGYO KABUSHIKI KAISHA |
| | P7 | 552 | 220 | ALONBRIGHT GR-LW552C by DENKI KAGAKU KOGYO KABUSHIKI KAISHA |
| Phosphor (C) | P8 | 620 | 180 | S-CASN BR-102F by Mitsubishi Chemical Corporation |
| | P9 | 630 | 166 | S-CASN BR-102C by Mitsubishi Chemical Corporation |

Each of the phosphors shown in Table 1 are the silicate phosphor (A), oxynitride phosphors (B) and nitride phosphor (C) used in the Examples and Comparative Examples. Of the silicate phosphor (A) in Table 1, P2 and P3 are phosphors satisfying the conditions that the peak wavelength is at least 525 nm but not higher than 535 nm and that the fluorescence intensity is at least 250% but not higher than 270%. Of the oxynitride phosphor (B) in Table 1, P6 only is a phosphor that satisfies the conditions that the peak wavelength is at least 540 nm but not higher than 545 nm and that the fluorescence intensity is at least 260% but not higher than 280%. Of the nitride phosphor (C) in Table 1, P8 only is a phosphor that satisfies the condition that the peak wavelength is at least 615 nm but not higher than 625 nm.

By mixing these phosphors at the ratio shown in Table 2, the phosphors according to the Examples and Comparative Examples were obtained.

TABLE 2

| | | | Example | | | | | | | | |
|---|---|---|---|---|---|---|---|---|---|---|---|
| | | | 1 | 2 | 3 | 4 | 5 | 6 | 7 | 8 | 9 |
| CoP* | (A) | P1 | | | | | | | | | |
| | | P2 | 35 | | 20 | | 28 | | 24 | 24.8 | 23.6 |
| | | P3 | | 20 | | 27 | | 25 | | | |
| | | P4 | | | | | | | | | |
| | (B) | P5 | | | | | | | | | |
| | | P6 | 50 | 70 | 60 | 60 | 60 | 60 | 59 | 64 | 62 |

TABLE 2-continued

|  |  |  |  |  |  |  |  |  |  |  |
|---|---|---|---|---|---|---|---|---|---|---|
|  | (C) | P7 |  |  |  |  |  |  |  |  |  |
|  |  | P8 | 15 | 10 | 20 | 13 | 12 | 15 | 17 | 10 | 10 |
|  |  | P9 |  |  |  |  |  |  |  |  |  |
|  | b/a |  | 1.4 | 3.5 | 3.0 | 2.2 | 2.1 | 2.4 | 2.5 | 2.6 | 2.6 |
|  | (a + b)/c |  | 5.7 | 9.0 | 4.0 | 6.7 | 7.3 | 5.7 | 4.9 | 8.9 | 8.6 |
| Ia** | Color-rendering: properties (ratio with respect to NTSC) |  | 74% | 75% | 75% | 77% | 78% | 76% | 76% | 77% | 77% |
|  | Brightness/ luminous flux |  | 29.4 | 31.1 | 31.8 | 30.9 | 32.7 | 31.4 | 31.9 | 32.3 | 32.5 |
| Htc*** | 50° C. |  | 99% | 100% | 99% | 99% | 100% | 99% | 99% | 99% | 99% |
|  | 100° C. |  | 96% | 98% | 97% | 97% | 98% | 97% | 97% | 97% | 97% |
|  | 150° C. |  | 92% | 96% | 95%. | 93% | 96% | 94% | 95% | 95% | 95% |
|  | 500 hrs |  | 98% | 100% | 100% | 99% | 100% | 99% | 99% | 99% | 99% |
|  | 2,000 hrs |  | 95% | 98% | 98% | 96% | 98% | 97% | 97% | 97% | 97% |

|  |  |  | Comparative Example |  |  |  |  |  |  |  |  |  |  |
|---|---|---|---|---|---|---|---|---|---|---|---|---|---|
|  |  |  | 1 | 2 | 3 | 4 | 5 | 6 | 7 | 8 | 9 | 10 | 11 |
| CoP* | (A) | P1 | 33 |  |  |  |  |  |  |  |  |  |  |
|  |  | P2 |  |  | 20 |  | 20 |  | 36 |  | 19 |  | 21 |
|  |  | P3 |  |  |  | 22 |  | 19 |  | 32 |  | 21 |  |
|  |  | P4 |  | 26 |  |  |  |  |  |  |  |  |  |
|  | (B) | P5 |  |  | 68 |  |  |  |  |  |  |  |  |
|  |  | P6 | 53 | 56 |  |  | 69 | 65 | 52 | 49 | 71 | 70 | 58 |
|  |  | P7 |  |  |  | 60 |  |  |  |  |  |  |  |
|  | (C) | P8 | 14 | 13 | 12 | 18 |  | 16 | 12 | 19 | 10 | 9 | 21 |
|  |  | P9 |  | 5 |  |  | 11 |  |  |  |  |  |  |
|  | b/a |  | 1.6 | 2.2 | 3.4 | 2.7 | 3.5 | 3.4 | 1.4 | 1.5 | 3.7 | 3.3 | 2.8 |
|  | (a + b)/c |  | 6.1 | 6.3 | 7.3 | 4.6 | — | 5.3 | 7.3 | 4.3 | 9.0 | 10.1 | 3.8 |
| Ia** | Color-rendering: properties (ratio with respect to NTSC) |  | 64% | 72% | 70% | 63% | 62% | 66% | 73% | 71% | 61% | 60% | 65% |
|  | Brightness/ luminous flux |  | 23.9 | 24.8 | 24.7 | 27.8 | 28.3 | 27.4 | 24.1 | 24.5 | 27.0 | 28.1 | 23.7 |
| Htc*** | 50° C. |  | 98% | 98% | 99% | 99% | 99% | 98% | 97% | 99% | 99% | 98% | 99% |
|  | 100° C. |  | 94% | 96% | 97%. | 97% | 97% | 95% | 92% | 95% | 97% | 97% | 97% |
|  | 150° C. |  | 88% | 91% | 94% | 93% | 94% | 92% | 86% | 89% | 94% | 92% | 94% |
|  | 500 hrs |  | 98% | 98% | 99% | 99% | 99% | 96% | 96% | 99% | 98% | 98% | 99% |
|  | 2,000 hrs |  | 88% | 94% | 95% | 96% | 97% | 93% | 87% | 89% | 94% | 95% | 97% |

"CoP*" means "Composition of the phosphor"
"Ia**" means "Initial assessment"
"Htc***" means "High-temperature characteristics"
"Lr****" means "Long-term reliability"

The phosphor in Example 1 was a composition obtained by mixing phosphor P2 in Table 1 by 35 mass % as the silicate phosphor (A), phosphor P6 in Table 1 by 50 mass % as the oxynitride phosphor (B), and phosphor P8 in Table 1 by 15 mass % as the nitride phosphor (C). In Table 2, the values of P1 to P9 in Composition of the phosphor represent mass percentage. To mix the phosphors, 2.5 g of the phosphors in total was measured and mixed in a vinyl bag, and the mixture was then mixed with 47.5 g of silicone resin (OE6656 by Dow Corning Toray) using a planetary centrifugal mixer ("Awatori Rentaro" ARE-310 [registered trademark] by THINKY). "b/a and (a+b)/c" in Table 2 are calculated value by assuming that a represents the amount of the silicate phosphor (A), b represents the amount of the oxynitride phosphor (B), and c represents the amount of the nitride phosphor (C).

To mount the phosphor to an LED, the LED was placed at the bottom of a concaved package main unit, wire bonding with the electrode on a substrate was performed, and then the mixed phosphors were injected using a micro-syringe. After the phosphor was mounted and hardened at 120° C., post-curing was performed at 110° C. for 10 hours for sealing. As the LED, the one having an emission peak wavelength of 448 nm and a chip in size of 1.0 mm×0.5 mm was used.

The assessment shown in Table 2 will hereinafter be described.

As the initial assessment in Table 2, color-rendering properties were adopted as one of the initial assessment. To assess the color-rendering properties, color reproduction range was used, and represented by the area (%) with respect to NTSC standard on the color coordinate. The larger the value, the higher the color-rendering properties. The passing criterion of the assessment is 72% or higher, which is the condition adopted for general LED-TVs.

The value of the brightness in Table 2 was assessed by the luminous flux (lm) at 25° C. The measurement taken after the current of 60 mA was applied for 10 minutes was adopted. The passing criterion of the assessment is 25 lm or higher. Since this value fluctuates depending on the measuring device used and conditions, the value was set by multiplying the lower limit value of each Example by 85% in order to make relative comparison with the Examples. When exceeding 30 lm, i.e., multiplying this acceptance value by 120%, it could be said to have an excellent brightness.

The high-temperature characteristics in Table 2 were assessed based on attenuation properties with respect to the luminous flux at 25° C. Luminous flux was measured at 50° C., 100° C., and 150° C., and the measurements were represented as the values with respect to the value measured at 25° C., which was regarded as 100%. The passing criterion of the assessment was 97% or higher at 50° C., 95% or higher at 100° C., and 90% or higher at 150° C. These values are not global standard values, but considered to be a guideline for highly reliable light-emitting devices.

The long-term reliability in Table 2 is expressed by the value of attenuation of luminous flux. The phosphors were left as they were at 85° C. and 85% RH for 500 hrs. and 2,000 hrs. respectively, they were then taken out and dried at a room temperature, and their luminous flux was measured and expressed in the percentage with respect to the initial value, which is regarded as 100%.

The passing criteria of the assessment is 96% or higher for 500 hrs., and 93% or higher for 2,000 hrs. These values cannot be achieved only by the silicate phosphor.

As shown in Table 2, the Examples of the present invention exhibited relatively good color-rendering properties and luminous flux values, and exhibited relatively small attenuation of luminous flux even when stored in a high-temperature or high-temperature/high-humidity environment for a long time.

Comparative Examples 1, 2, 3, 7, 8, and 11 had a small luminous flux value, and Comparative Examples 1, 4, 5, 6, 9, 10, and 11 had lower color-rendering properties. Comparative Example 1, where used silicate fell outside the range of the present invention, Comparative Example 7, where too much silicate phosphor A was added, in addition, Comparative Example 8, where too few oxynitride phosphor B was added, were inferior in high-temperature characteristics and long-term reliability, causing the reliability of the LED package to become low. It can hardly be used for products such as TVs and monitors.

INDUSTRIAL APPLICABILITY

The phosphor of the present invention is used for a white light-emitting device. The white light-emitting device of the present invention is used for the backlight of LC panels, illuminating devices, signaling systems, and image display devices.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A phosphor, comprising: a silicate phosphor (A) having a peak wavelength at least 525 nm but not higher than 535 nm and fluorescence intensity at least 250% but not higher than 270%;
    an oxynitride phosphor (B) having a peak wavelength at least 540 nm but not higher than 545 nm and fluorescence intensity at least 260% but not higher than 280%; and
    a nitride phosphor (C) having a peak wavelength at least 615 nm but not higher than 625 nm,
    wherein, the ratio of the silicate phosphor (A) is at least 20% but not higher than 35% by mass; the ratio of the oxynitride phosphor (B) is at least 50% but not higher than 70% by mass; and the ratio of the nitride phosphor (C) is at least 10% but not higher than 20% by mass.

2. The phosphor as set forth in claim 1, wherein assuming the ratio of the silicate phosphor (A) and that of the oxynitride phosphor (B) as a and b, the ratio satisfies $1.5 \leq b/a \leq 3.5$.

3. The phosphor as set forth in claim 1 or 2, wherein assuming the ratio of the silicate phosphor (A), that of the oxynitride phosphors (B) and that of the nitride phosphor (C) as a, b, and c, the ratio satisfies $4.0 \leq (a+b)/c \leq 8.2$.

4. The phosphor as set forth in claim 1 or 2, wherein the oxynitride phosphor (B) is β-SiAlON, and the nitride phosphor (C) is SCASN.

5. The phosphor as set forth in claim 3, wherein the oxynitride phosphor (B) is β-SiAlON, and the nitride phosphor (C) is SCASN.

6. The light-emitting device having the phosphor as set forth in claim 1 and an LED mounting the phosphor on its light-emitting surface.

* * * * *